United States Patent
Lee et al.

(10) Patent No.: US 6,802,911 B2
(45) Date of Patent: Oct. 12, 2004

(54) METHOD FOR CLEANING DAMAGED LAYERS AND POLYMER RESIDUE FROM SEMICONDUCTOR DEVICE

(75) Inventors: Keum Joo Lee, Inchon (KR); Yong Sun Ko, Suwon (KR); In Seak Hwang, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 128 days.

(21) Appl. No.: 09/955,126

(22) Filed: Sep. 19, 2001

(65) Prior Publication Data

US 2003/0056806 A1 Mar. 27, 2003

(51) Int. Cl.$^7$ ................................................ B08B 3/00
(52) U.S. Cl. ....................... 134/28; 134/3; 134/26; 134/34; 134/36; 438/906; 216/90; 216/91; 216/108; 216/109
(58) Field of Search ................ 134/3, 26, 28, 134/34, 36, 902; 438/906; 216/90, 91, 108, 109

(56) References Cited

U.S. PATENT DOCUMENTS

| | | | | |
|---|---|---|---|---|
| 4,302,273 A | * | 11/1981 | Howard, Jr. ............ | 156/345.11 |
| 5,759,971 A | * | 6/1998 | Manako ...................... | 510/175 |
| 5,868,855 A | | 2/1999 | Fukazawa et al. | |
| 5,979,474 A | * | 11/1999 | Manako .................. | 134/102.1 |
| 5,994,238 A | | 11/1999 | Park | |
| 6,203,627 B1 | * | 3/2001 | Shindo et al. ................ | 134/18 |
| 6,323,140 B1 | * | 11/2001 | Mayusumi et al. ......... | 438/787 |
| 6,423,146 B1 | * | 7/2002 | Fukazawa ...................... | 134/2 |
| 2002/0026952 A1 | * | 3/2002 | Fujino et al. ................ | 134/1.3 |

FOREIGN PATENT DOCUMENTS

| | | | |
|---|---|---|---|
| JP | 7-37851 | * | 2/1995 |
| JP | 8-45886 | | 2/1996 |
| JP | 8-250460 | | 9/1996 |
| KR | 1998-15769 | | 5/1998 |

* cited by examiner

Primary Examiner—M. Kornakov
(74) Attorney, Agent, or Firm—Lee & Sterba, P.C.

(57) ABSTRACT

A method of cleaning damaged layers and polymer residue on semiconductor devices includes mixing HF and ozone water in a vessel to form a solution of HF and ozone water, and dipping a semiconductor device in the vessel containing the solution of HF and ozone water. Preferably, ozone water is subsequently introduced into the vessel to replace the solution of HF and ozone water in the vessel.

40 Claims, 4 Drawing Sheets

METHOD FOR CLEANING DAMAGED LAYERS AND POLYMER RESIDUE FROM SEMICONDUCTOR DEVICE

BACKGROUND OF THE INVENTION

1. Field of the Invention

The present invention is directed to a method of cleaning semiconductor devices and, more particularly, to a method of cleaning damaged layers and polymer residue on semiconductor devices.

2. Description of the Related Art

As the design rule of semiconductor device gets smaller, the contact region between layers decreases. Due to the small sizes involved, it is difficult to use conventional methods to form a contact region. Accordingly, a manufacturing process that self-aligns the contact pad with a semiconductor layer or an interconnect layer underlying the contact pad is employed for sub-quarter micron semiconductor devices. The resulting self-aligned contact (SAC) has the advantages of allowing increased margin for misalignment error during photolithography, and reducing contact resistance. In the case of forming the SAC, an etch technique having high selectivity is necessary.

However, it is difficult to remove the damage layer and polymer residue resulting from high-selectivity etch. Accordingly, a cleaning technique is required to remove the damage layer and polymer residue. A conventional cleaning solution contains APM ($NH_4OH/H_2O_2/H2O$) or SPM ($H_2SO_4/H_2O_2$ mixture).

Metal layers are often used in order to increase the speed of semiconductor devices. However, conventional cleaning solutions such, as the foregoing solution, damage metal layers. Therefore, cleaning solutions with EKC ($NH_4OH/C_6H_4(OH)_2$/Aminoethoxyethanol) or SMF ($NH_4OH/CH_3COOH/H_2O/HF$) are used. However, EKC and SMF solutions do not remove the damage layer and polymer residue resulting from etch processes; therefore, contact resistance increases and failures of semiconductor devices occur. Accordingly, there is a need for a method for removing the damaged layer and polymer residue without damaging the metal layer of a semiconductor device.

SUMMARY OF THE INVENTION

In accordance with one aspect of the present invention, there is provided a method of cleaning a semiconductor device which includes the steps of: mixing HF and ozone water in a vessel to form a solution of HF and ozone water; and dipping a semiconductor device in the vessel containing the solution of HF and ozone water, wherein the solution contains about 0.034 to about 0.077 wt % HF.

In a more specific embodiment, the ozone water contains about 5 to about 150 ppm ozone. In another more specific embodiment, the semiconductor device is dipped for about 1 to about 30 minutes.

Preferably, damaged layers and polymer residue are removed from the semiconductor device by the inventive method.

In accordance with another aspect of the present invention, there is provided a method of cleaning a semiconductor device including the steps of: mixing HF and ozone water in a vessel to form a solution of HF and ozone water; dipping a semiconductor device in the vessel containing the solution of HF and ozone water, and thereafter introducing ozone water into the vessel to replace the solution of HF and ozone water in the vessel, wherein the solution includes about 0.034 to about 0.077 wt % HF.

In more specific embodiments, ozone water is flowed into the vessel thereby causing an overflow of the solution of HF and ozone water out of the vessel. According to specific embodiments, the ozone water is flowed into the vessel thereby causing the overflow of the solution of HF and ozone water out of the vessel for a period between about 1 and about 30 minutes.

In accordance with a further aspect of the present invention, there is provided a method of cleaning a semiconductor device including the steps of: introducing HF and ozone water into a vessel to form a solution of HF and ozone water; mixing the HF and ozone water in the vessel to form a uniform solution of HF and ozone water; and dipping a semiconductor device in the vessel containing the uniform solution of HF and ozone water.

In more particular embodiments, the HF and ozone water are mixed to form a uniform solution by circulation, more specifically by means of a pump.

In specific embodiments, the HF and ozone water are circulated by flowing the HF and ozone water from an inner bath to an outer bath and pumped back into the inner bath.

In accordance with still another aspect of the present invention, there is provided a method of cleaning a semiconductor device including the steps of: introducing HF and ozone water into a vessel to form a solution of HF and ozone water; mixing the HF and ozone water in the vessel to form a uniform solution of HF and ozone water; dipping a semiconductor device in the vessel containing the uniform solution of HF and ozone water; and introducing ozone water into the vessel to replace the solution of HF and ozone water in the vessel.

Other features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The above features and advantages of the present invention will become more apparent by describing in detail specific embodiments thereof with reference to the attached drawings in which.

DETAILED DESCRIPTION OF THE INVENTION

Figure 1A:
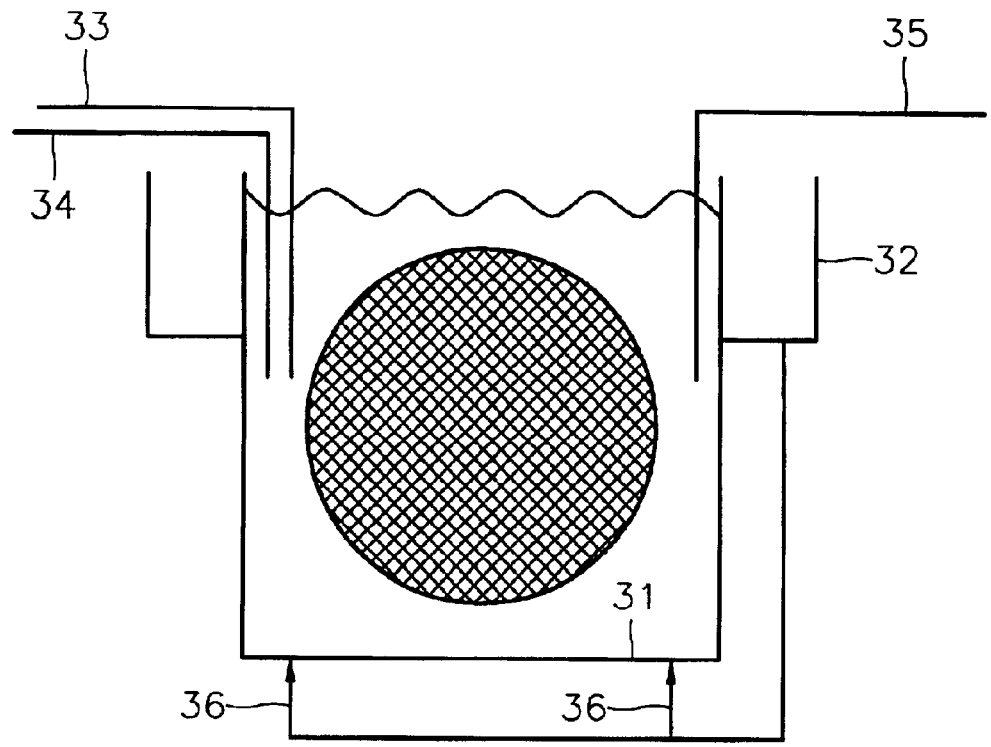
FIGS. 1A and 1B illustrate a cleaning method according to the present invention employing an exemplary apparatus as illustrated.

After forming a contact hole, polymer residue and damage layers resulting from etch process, which are a kind of abnormal oxide, remain. In order to remove the polymer residue and damage layers, the present invention use a cleaning solution with a mixture of ozone water and hydrofluoric acid (HF). Ozone water is effective in removing organic material such as polymers. Also, ozone water does not give rise to environment concerns. HF is effective in removing damage layers and polymer residue.

Ozone decomposes to generate active radicals, which work as strong oxidizers. The decomposition mechanism is as follows:

$$O_3 + OH^- \rightarrow O_2^- + HO_2^* \quad (1)$$

$$O_3 + HO_2^* \rightarrow 2O_2 + OH^* \quad (2)$$

$$O_3 + OH^* \rightarrow O_2 + HO_2^* \quad (3)$$

$$2H_2O^* \rightarrow O_3 + H_2O \quad (4)$$

$$HO_2^* + OH^* \rightarrow O_2 + H_2O \quad (5)$$

The active radicals react with the organic material on the surface of the semiconductor substrate to break C—H, C—C, and C=O bonds. Thus, organic material is easily removed and the surface is oxidized.

The reaction mechanism of ozone ($O_3$) is as follows:

$$O_3 + \text{organic material (e.g. polymer)} \rightarrow CO_2 + H_2O \quad (1)$$

$$O_3 + M(\text{surface}) \rightarrow MOx + O_2 \quad (2)$$

The present invention provides a cleaning process using the cleaning solution with ozone water and HF as follows (referring to FIGS. 1A–B): first, inner bath 31 is supplied with ozone water and HF through supply lines 33, 34, respectively. Next, ozone water and HF are mixed by circulation. The circulation preferably is carried out by flowing the cleaning solution in the inner bath 31 into an outer bath 32 and then again flowing cleaning solution from outer bath 32 into the inner bath 31 through supply line 36 using a working pump connected to the outer bath 32. Then, a semiconductor device is dipped into the bath.

Figure 1B:
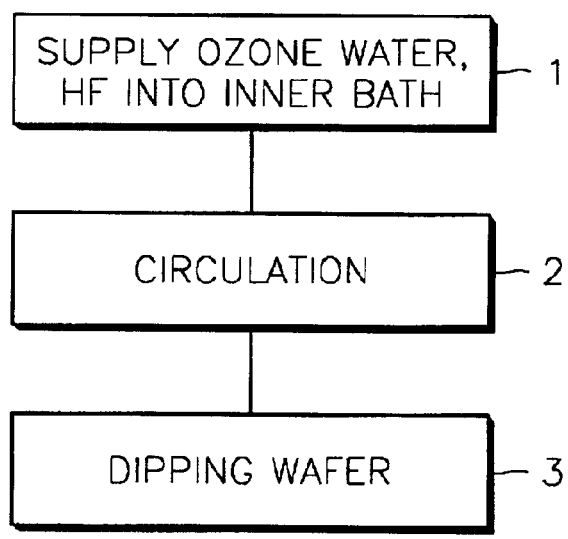

It is desirable to overflow the ozone water after the last step (3) in FIG. 1B. Ozone water is overflowed by supplying it through the supply line 33. Overflowing ozone water rinses the cleaning solution off and makes the surface of the semiconductor device hydrophilic to prevent contamination on the surface of the semiconductor.

In step 1 in FIG. 1B, it is effective that the concentration of the ozone water is between about 22 and about 27 ppm.

Figure 2:
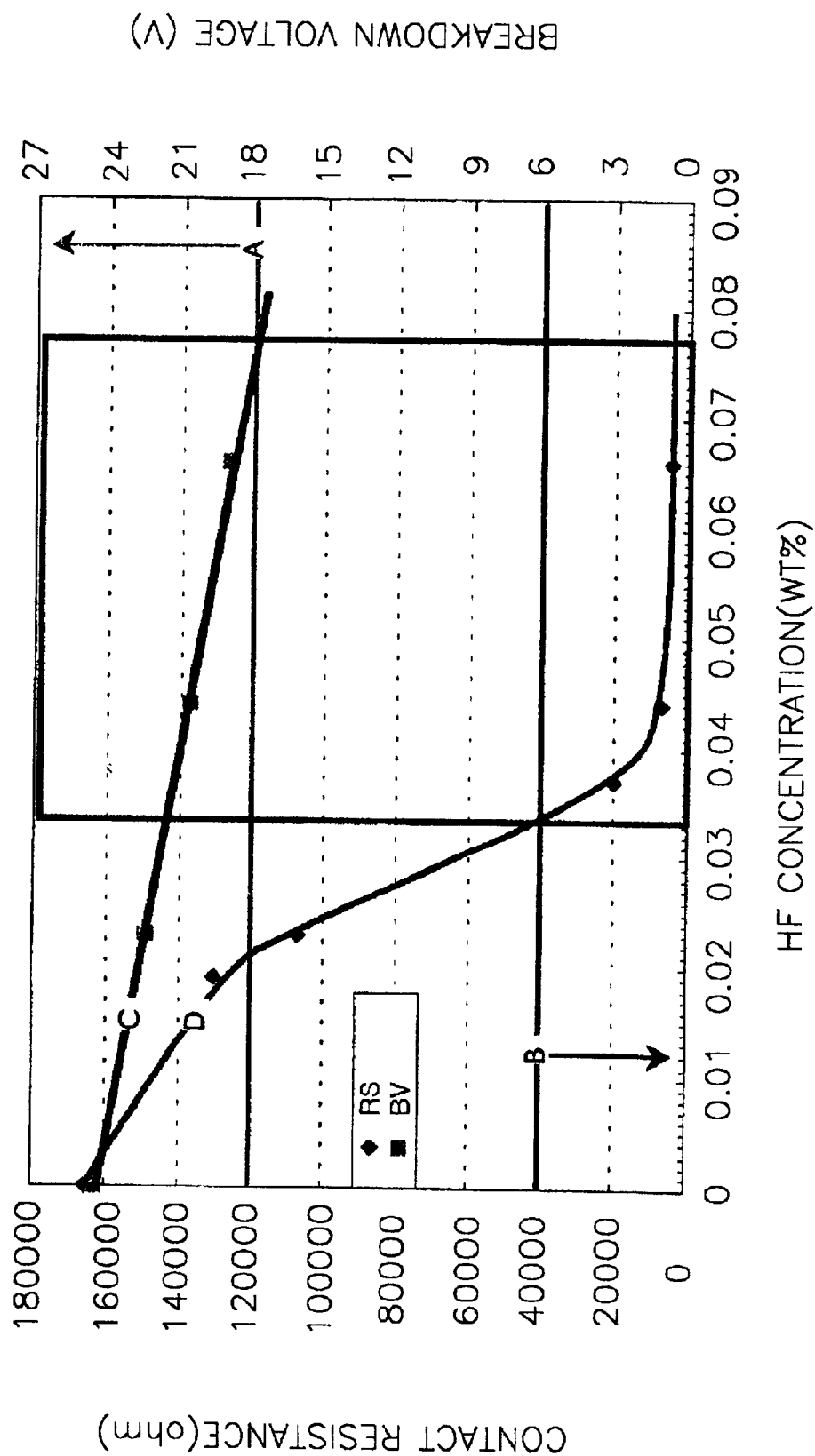
FIG. 2 is a graph showing the resistance of the contact region and breakdown voltage between the contact region and the conductive layer adjacent to the contact region as shown in FIGS. 5 and 6.
Figure 5:
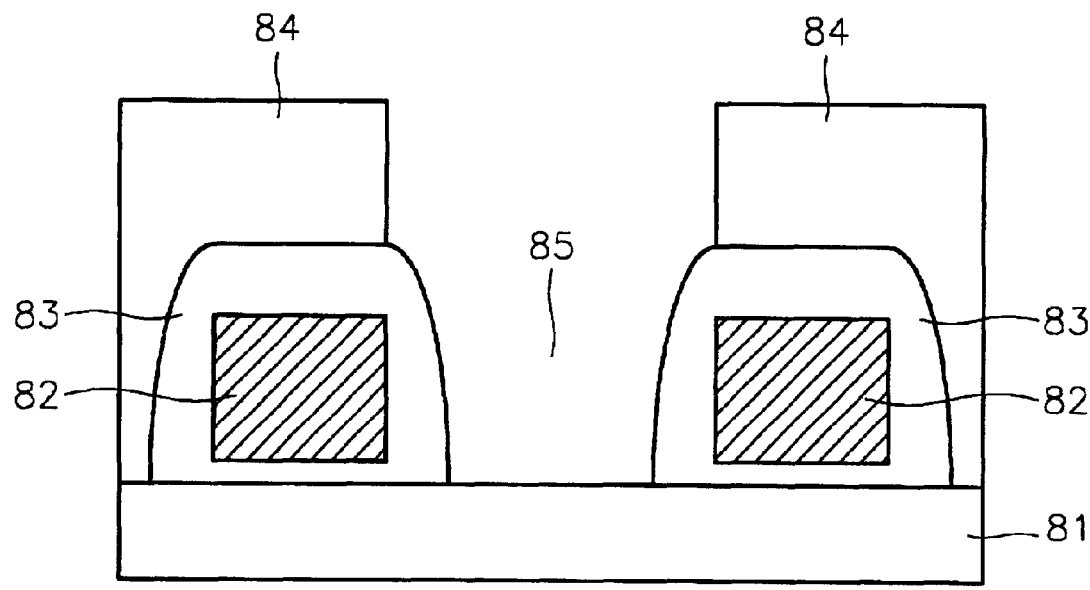
FIGS. 5 and 6 illustrate examples of semiconductor processes in which embodiments of cleaning methods according to the present invention are applied.
Figure 6:
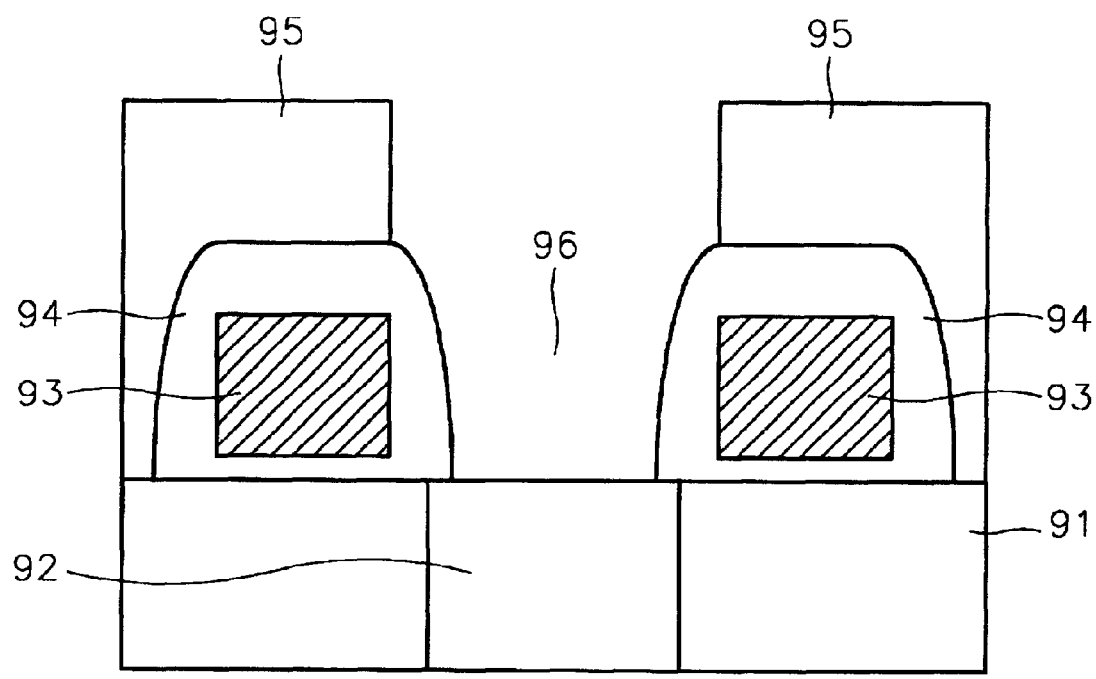

FIG. 2 shows the resistance of the contact region and the breakdown voltage between the contact region and conductive layer adjacent to the contact region as shown in FIGS. 5 and 6, according to the concentration of HF after cleaning by using HF and ozone water solution (the concentration of $O_3$ in ozone water being about 20 ppm). Line D shows that as the concentration of HF increases, the resistance of the contact region decreases. The resistance below line B (line B indicating 40 kohm) doesn't lead to failure of the device. To meet this condition, the concentration of HF preferably should be more than about 0.034 wt %.

Line C shows that the breakdown voltage between the contact region and the conductive layer adjacent to the contact region decreases as the concentration of HF increases. The decrease in the breakdown voltage means an increase in the leakage current between the contact region and the conductive layer. The breakdown voltage above line A (line A indicating 18V) doesn't lead to failure of the device. To meet this condition, the concentration of HF preferably should be less than about 0.077 wt %.

Accordingly, the effective concentration of HF preferably is about 0.034 to about 0.077 wt % in order to decrease the resistance of the contact region without decreasing the breakdown voltage between the contact region and conductive layer.

In step 2 in FIG. 1B, it is important to mix the ozone water and HF without dropping the concentration of $O_3$. After supplying the ozone water and HF into the inner bath, the ozone water and HF from the inner bath to the outer bath is circulated before dipping wafers into the bath. Without the circulation, the uniformity of etch rate is about 0.3%. With circulation, the uniformity of the etch rate is about 0.1 to about 0.15%. Referring to table 1, it is desirable that the circulation proceed for about 30 to about 60 secs after supplying the ozone water and HF.

TABLE 1

| Circulation time(sec.) | 0 | 30 | 60 | 120 |
|---|---|---|---|---|
| Drop of $O_3$ concentration | | 1.3 ppm | 2.2 ppm | 4.7 ppm |
| Etch uniformity | About 0.3% | 0.1~0.15% | 0.1~0.15% | 0.1~0.15% |

Figure 3:
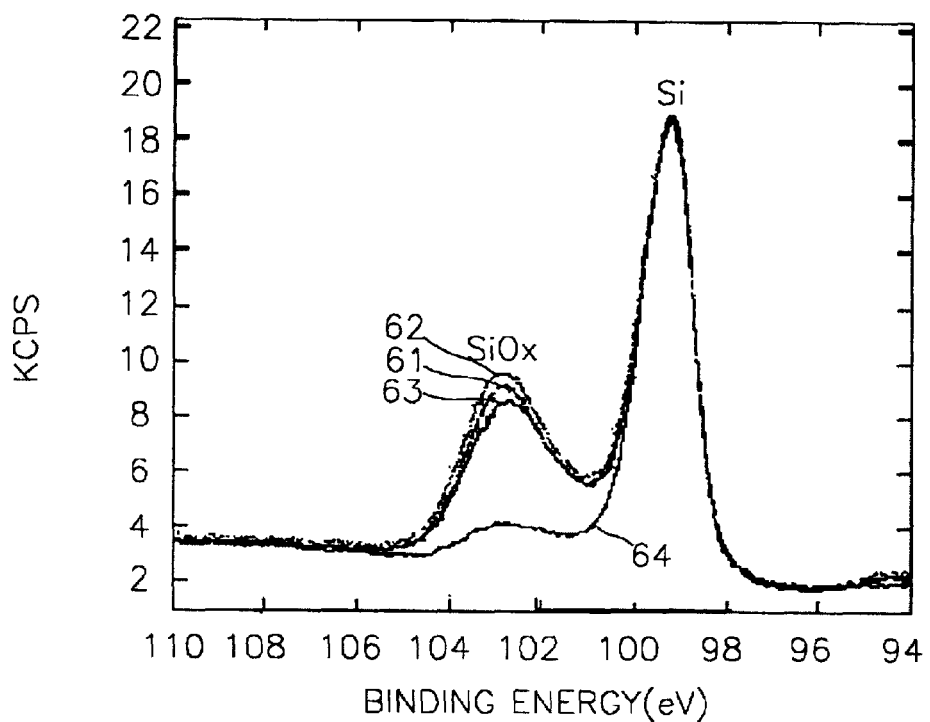
FIGS. 3 and 4 are X-ray photospectroscopy (XPS) analysis graphs comparing cleaning methods according to the invention with prior art methods.
Figure 4:
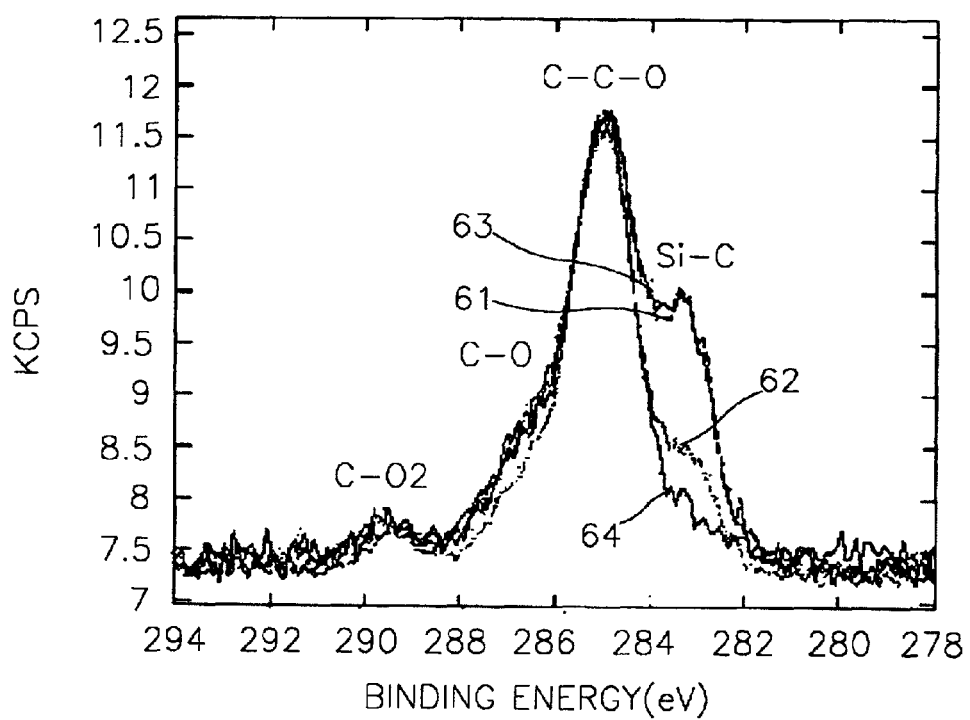

FIGS. 3 and 4 present X-ray Photospectroscopy (XPS) analysis graphs. The graph line 61 shows the result of no cleaning after forming a contact region. Graph line 62 shows the result of cleaning with EKC. Graph line 63 shows the result of cleaning with SMF. Graph line 64 shows the result of cleaning with ozone water and HF using a method of the present invention.

As seen in FIG. 3, when the present invention is applied to cleaning the contact region, the $SiO_x$ peak decreased. $SiO_x$ is considered a contaminant. As seen in FIG. 4, when the present invention is applied to cleaning the contact region, the Si—C peak decreases.

FIGS. 5 and 6 show examples of semiconductor processes in which methods according to the present invention is applied. FIG. 5 shows a Self Aligned Contact (SAC) structure, which is formed as follows. A gate insulator (not shown) is first formed on a semiconductor substrate 81. Next, a gate electrode 82 is formed on the gate insulator. A first dielectric layer 83 is then formed on the gate electrode 82 and the surface of the semiconductor substrate 81. A second dielectric layer 84 is formed on the first dielectric layer 83, wherein the second dielectric layer 84 has a high etch selectivity compared to first dielectric layer 83. Then, a contact hole 85 is formed by etching the second and first dielectric layers.

The second dielectric layer 84 preferably has a high etch selectivity compared to the first dielectric layer 83 so that the gate electrode is not exposed during the etch. For example, a nitride layer can be used as the first dielectric layer 83, and an oxide layer can be used as the second dielectric layer 84.

After forming the contact hole by using a cleaning method according to the present invention, the damage layer and the polymer residue resulting from the etch process are removed.

FIG. 6 shows a contact hole, wherein the contact hole connects a storage electrode to a contact pad. The contact hole is formed between bit lines. Thus, a dielectric layer 91 is provided in which a conductive layer 92 (i.e., a storage electrode) is formed. A bit line 93 is next formed, followed by formation of a first dielectric layer 94 and a second dielectric layer 95. Contact hole 96 is then formed by etching the first and second dielectric layers 94 and 95. After forming the contact hole 96 as shown FIG. 6, by using a cleaning method of the present invention, the damage layer and the polymer residue resulting from the etch process are removed.

While this invention has been particularly shown and described with reference to specific embodiments thereof, it will be understood by those skilled in the art that various changes in form and details may be made to the described embodiments without departing from the spirit and scope of the invention as defined by the appended claims.

What is claimed is:

1. A method of cleaning a semiconductor device having a contact region adjacent to a conductive layer, comprising:
   (i) mixing HF and ozone water in a vessel to form a solution of HF and ozone water; and
   (ii) dipping the semiconductor device in the vessel containing the solution of HF and ozone water,
   wherein the solution comprises about 0.034 to about 0.077 wt % HF,
   whereby a resistance of the contact region is reduced without causing a decrease in breakdown voltage in the semiconductor device.

2. The method of claim 1, wherein the solution of HF and ozone water comprises about 0.035 to about 0.075 wt % HF.

3. The method of claim 1, wherein the ozone water comprises about 5 to about 150 ppm ozone.

4. The method of claim 3, wherein the ozone water comprises about 15 to about 30 ppm ozone.

5. The method of claim 1, wherein in step (ii) the semiconductor device is dipped for a period between about 1 and about 30 minutes.

6. The method of claim 5, wherein the semiconductor device is dipped for a period of about 15 minutes.

7. The method of claim 1, whereby damaged layers and polymer residue are removed from the semiconductor device.

8. A method of cleaning a semiconductor device having a contact region adjacent to a conductive layer, comprising:
   (i) mixing HF and ozone water in a vessel to forms solution of HF and ozone water;
   (ii) dipping the semiconductor device in the vessel containing the solution of HF and ozone water, and thereafter
   (iii) introducing ozone water into the vessel to replace the solution of HF and ozone water in the vessel,
   wherein the solution comprises about 0.034 to about 0.077 wt % HF,
   whereby a resistance of the contact region is reduced without causing a decrease in breakdown voltage in the semiconductor device.

9. The method of claim 8, wherein the solution of HF and ozone water comprises about 0.035 to about 0.075 wt % HF.

10. The method of claim 8, wherein the ozone water comprises about 5 to about 150 ppm ozone.

11. The method of claim 10, wherein the ozone water comprises about 15 to about 30 ppm ozone.

12. The method of claim 8, wherein in step (ii) the semiconductor device is dipped for a period between about 1 and about 30 minutes.

13. The method of claim 12, wherein the semiconductor device is dipped for a period of about 15 minutes.

14. The method of claim 8, wherein in step (iii) ozone water is flowed into the vessel thereby causing an overflow of the solution of HF and ozone water out of the vessel.

15. The method of claim 14, wherein the ozone water is flowed into the vessel thereby causing the overflow of the solution of HE and ozone water out of the vessel for a period between about 1 and about 30 minutes.

16. The method of claim 15, wherein the period is about 20 minutes.

17. The method of claim 8, whereby damaged layers and polymer residue are removed from the semiconductor device.

18. A method of cleaning a semiconductor device having a contact region adjacent to a conductive layer, comprising:
   (i) introducing HF and ozone water into a vessel to farm a solution of HF and ozone water, wherein the solution includes about 0.034 to about 0.077 wt % HF;
   (ii) mixing the HF and ozone water in the vessel to form a uniform solution of HF and ozone water, and
   (iii) dipping the semiconductor device in the vessel containing the uniform solution of HF and ozone water,
   whereby a resistance of the contact region is reduced without causing a decrease in breakdown voltage in the semiconductor device.

19. The method of claim 18, wherein the solution of HF and ozone water comprises about 0.035 to about 0.075 wt % HF.

20. The method of claim 18, wherein the ozone water comprises about 5 to about 150 ppm ozone.

21. The method of claim 20, wherein the ozone water comprises about 15 to about 30 ppm ozone.

22. The method of claim 18, wherein in step (iii) the semiconductor device is dipped for a period between about 1 and about 30 minutes.

23. The method of claim 22, wherein the semiconductor device is dipped for a period of about 15 minutes.

24. The method of claim 18, wherein in step (ii) the HF and ozone water are mixed to form a uniform solution by circulation.

25. The method of claim 24, wherein the HF and ozone water are circulated by a pump.

26. The method of claim 25, wherein the HF and ozone water are circulated by flowing the HF and ozone water from an inner bath to an outer bath and pumped back into the inner bath.

27. The method of claim 18, whereby damaged layers and polymer residue are removed from the semiconductor device.

28. A method of cleaning a semiconductor device having a contact region adjacent to a conductive layer, comprising:
   (i) introducing HF and ozone water into a vessel to form a solution of HF and ozone water, wherein the solution includes about 0.034 to about 0.077 wt % HF;
   (ii) mixing the HF and ozone water in the vessel to foam a uniform solution of HF and ozone water;
   (iii) dipping the semiconductor device in the vessel containing the uniform solution of HF and ozone water; and
   (iv) introducing ozone water into the vessel to replace the solution of HF and ozone water in the vessel,
   whereby a resistance of the contact region is reduced without causing a decrease in breakdown voltage in the semiconductor device.

29. The method of claim 28, wherein the solution of HF and ozone water comprises about 0.035 to about 0.075 wt % HF.

30. The method of claim 28, wherein the ozone water comprises about 5 to about 150 ppm ozone.

31. The method of claim 30, wherein the ozone water comprises about 15 to about 30 ppm ozone.

32. The method of claim 28, wherein in step (iii) the semiconductor device is dipped for a period between about 1 and about 30 minutes.

33. The method of claim 32, wherein the semiconductor device is dipped for a period of about 15 minutes.

34. The method of claim 28, wherein in step (iv) ozone water is flowed into the vessel thereby causing an overflow of the solution of HP and ozone water out of the vessel.

35. The method of claim 3, wherein che ozone water is flowed into the vessel thereby causing the overflow of the solution of HF and ozone water out of the vessel for a period between about 1 and about 30 minutes.

36. The method of claim 35, wherein the period is about 20 minutes.

37. The method of claim 28, wherein in step (ii) the HF and ozone water are mixed to form a uniform solution by circulation.

38. The method of claim 37, wherein the HF and ozone water are circulated by a pump.

39. The method of claim 38, wherein the HF and ozone water are circulated by flowing the HF and ozone water from an inner bath to an outer bath and pumped back into the inner bath.

40. The method of claim 28, whereby damaged layers and polymer residue are removed from the semiconductor device.

* * * * *